US012751232B2

(12) United States Patent
Chang et al.

(10) Patent No.: US 12,751,232 B2
(45) Date of Patent: Sep. 29, 2026

(54) SEMICONDUCTOR TRANSPORT SYSTEM AND METHOD OF TRANSPORTING SEMICONDUCTOR

(71) Applicant: SAMSUNG ELECTRONICS CO., LTD., Suwon-si (KR)

(72) Inventors: Minseock Chang, Suwon-si (KR); Kunho Kwak, Suwon-si (KR); Kibong Roh, Suwon-si (KR); Sangyong Lee, Suwon-si (KR); Jinyoung Lee, Suwon-si (KR); Kyungjin Lim, Suwon-si (KR); Jaehong Kwon, Suwon-si (KR); Inki Hong, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 276 days.

(21) Appl. No.: 18/404,333

(22) Filed: Jan. 4, 2024

(65) Prior Publication Data

US 2024/0222147 A1 Jul. 4, 2024

(30) Foreign Application Priority Data

Jan. 4, 2023 (KR) ........................ 10-2023-0001331
Feb. 28, 2023 (KR) ........................ 10-2023-0026913

(51) Int. Cl.
*H10P 72/00* (2026.01)
*B65B 11/58* (2006.01)
(Continued)

(52) U.S. Cl.
CPC .............. *H10P 72/00* (2026.01); *B65B 11/58* (2013.01); *B65B 51/00* (2013.01); *B65B 57/00* (2013.01)

(58) Field of Classification Search
CPC ......... B65B 57/00; B65B 11/58; B65B 51/00; H10P 72/00; H10P 72/1924
See application file for complete search history.

(56) References Cited

U.S. PATENT DOCUMENTS 4,248,346 A * 2/1981 Johnson .............. H10P 72/1912 206/711
5,036,646 A * 8/1991 Makihara ............ H10P 72/1911 53/478
(Continued)

FOREIGN PATENT DOCUMENTS

JP 6-151548 A 5/1994
JP H06151548 A * 5/1994 .......... H10P 72/1911
(Continued)

OTHER PUBLICATIONS

Translation of JPH06151548A (Year: 1994).*
(Continued)

*Primary Examiner* — Thomas M Wittenschlaeger
(74) *Attorney, Agent, or Firm* — Sughrue Mion, PLLC

(57) ABSTRACT

A method of transporting a semiconductor is provided and includes: providing an accommodation container accommodating a wafer and including nitrogen gas to a packaging chamber; performing, in the packaging chamber, a first packaging on the accommodation container by packaging the accommodation container with vinyl; performing a second packaging on the accommodation container, on which the first packaging has been performed, by packaging the accommodation container with a logistics bag; transporting the accommodation container to a standby chamber and standing by the accommodation container in the standby chamber; and transporting the accommodation container that was in standby in the standby chamber by using a transporter in the transport chamber. A temperature of the standby chamber, in which the accommodation container is
(Continued)

in standby, is maintained in a range of 18° C. to 23.5° C., and a humidity of the standby chamber is maintained in a range of 0% to 45%.

16 Claims, 14 Drawing Sheets

(51) Int. Cl.

| | |
|---|---|
| ***B65B 51/00*** | (2006.01) |
| ***B65B 57/00*** | (2006.01) |

(56) References Cited

U.S. PATENT DOCUMENTS

| | | | | |
|---|---|---|---|---|
| 10,177,019 | B2 * | 1/2019 | Keam | H10P 72/1924 |
| 2006/0288665 | A1 * | 12/2006 | Imao | B65B 31/046<br>53/284.7 |
| 2018/0286726 | A1 * | 10/2018 | Rebstock | H10P 72/1926 |
| 2020/0168493 | A1 * | 5/2020 | Sunugatov | H10P 72/3302 |
| 2021/0327737 | A1 * | 10/2021 | Sakata | H10P 72/1924 |

FOREIGN PATENT DOCUMENTS

| | | | | |
|---|---|---|---|---|
| KR | 20050066083 | A * | 6/2005 | H10P 72/0602 |
| KR | 10-0524233 | B1 | 10/2005 | |
| KR | 10-2007-0003400 | A | 1/2007 | |
| KR | 10-0974801 | B1 | 8/2010 | |
| KR | 10-2013-0104316 | A | 9/2013 | |
| KR | 10-1312070 | B1 | 9/2013 | |
| KR | 10-1456381 | B1 | 10/2014 | |
| KR | 10-2017-0069393 | A | 6/2017 | |
| KR | 10-2017-0131874 | A | 12/2017 | |
| KR | 10-2222088 | B1 | 3/2021 | |
| WO | WO-2011135639 | A1 * | 11/2011 | H10P 72/1924 |
| WO | WO-2020250267 | A1 * | 12/2020 | H10P 72/10 |

OTHER PUBLICATIONS

Translation of WO 2011/135639 A1 (Year: 2011).*
Translation of KR 20050066083 A (Year: 2005).*
Translation of WO 2020250267 A1 (Year: 2020).*
"Versatile Worker for Transporting Cargoes, Forklift? Right Track for Logistics!", (https://blog.naver.com/forst06/222908072639), Oct. 23, 2022, 14 pages.

* cited by examiner

SEMICONDUCTOR TRANSPORT SYSTEM AND METHOD OF TRANSPORTING SEMICONDUCTOR

CROSS-REFERENCE TO RELATED APPLICATIONS

This application is based on and claims priority under 35 U.S.C. § 119 to Korean Patent Application No. 10-2023-0001331, filed on Jan. 4, 2023, and Korean Patent Application No. 10-2023-0026913, filed on Feb. 28, 2023, in the Korean Intellectual Property office, the disclosures of which are incorporated by reference herein in their entireties.

BACKGROUND

1. Technical Field

Embodiments of the present disclosure relate to a semiconductor transport system and a method of transporting a semiconductor. More particularly, embodiments of the present disclosure relate to a semiconductor transport system including a standby chamber configured to maintain internal temperature within a constant range and internal humidity within a constant range, and a method of transporting a semiconductor.

2. Description of the Related Art

To manufacture a semiconductor device, various processes, such as development, exposure, and cleaning, are sequentially performed on a wafer. In this case, to efficiently manufacture a semiconductor device, the various processes may be performed respectively and separately by a plurality of semiconductor manufacturing facilities arranged at different locations. Accordingly, during the semiconductor device manufacturing processes, the wafer may be transported to each of the plurality of semiconductor manufacturing facilities. On the other hand, the wafer may be transported to each of the plurality of semiconductor manufacturing facilities while being accommodated in an accommodation container. In this case, when the internal temperature or internal humidity inside the accommodation container changes due to the external environment during the transport process, there may be an inflow of a contaminant into the accommodation container from the external environment, and the inflow of the contaminant into the accommodation container may contaminate the wafer accommodated in the accommodation container, for which a solution is required.

SUMMARY

Embodiments of the present disclosure provide a semiconductor transport system capable of preventing an inflow of a contaminant into an accommodation container from the external environment by maintaining the internal temperature and the internal humidity of the accommodation container, in which a wafer is accommodated, within constant ranges, and in this manner, preventing contamination of the wafer accommodated in the accommodation container, and a method of transporting a semiconductor.

According to embodiments of the present disclosure, a method of transporting a semiconductor is provided and includes: providing an accommodation container accommodating a wafer and including nitrogen gas to a packaging chamber: performing, in the packaging chamber, a first packaging on the accommodation container by packaging the accommodation container with vinyl: performing a second packaging on the accommodation container, on which the first packaging has been performed, by packaging the accommodation container with a logistics bag: transporting the accommodation container, on which the first packaging and the second packaging have been performed, to a standby chamber and standing by the accommodation container in the standby chamber: and transporting the accommodation container that was in standby in the standby chamber by using a transporter in the transport chamber, wherein an internal temperature of the standby chamber, in which the accommodation container is in standby, is maintained in a range of 18° C. to 23.5° C., and an internal humidity of the standby chamber is maintained in a range of 0% to 45%.

According to embodiments of the present disclosure, a semiconductor transport system is provided and includes: a packaging chamber configured to perform first packaging on an accommodation container that accommodates a wafer and that includes nitrogen gas, and perform second packaging on the accommodation container with a logistics bag: a standby chamber configured to accommodate the accommodation container on which the first packaging and the second packaging have been performed: and a transport chamber configured to transport the accommodation container on which the first packaging and the second packaging have been performed: a first door between the packaging chamber and the standby chamber: a first air curtain on the first door: a second door between the standby chamber and the transport chamber; a second air curtain on the second door; a temperature controller inside the standby chamber; and a controller configured to maintain a temperature of the standby chamber in a range of 18° C. to 23.5° C., and maintain a humidity of the standby chamber in a range of 0% to about 45% by operating the first air curtain, the second air curtain, and the temperature controller.

According to embodiments of the present disclosure, a method of transporting a semiconductor is provided and includes: providing an accommodation container accommodating a wafer and including nitrogen gas to a packaging chamber of a first semiconductor transport system: performing, in the packaging chamber, a first packaging on the accommodation container by packaging the accommodation container with vinyl; performing a second packaging on the accommodation container, on which the first packaging has been performed, by packaging the accommodation container with a logistics bag; transporting the accommodation container, on which the first packaging and the second packaging have been performed, to a standby chamber of the first semiconductor transport system, and standing by the accommodation container in the standby chamber: transporting the accommodation container that was in standby in the standby chamber to a second semiconductor transport system by using a transporter in a transport chamber of the first semiconductor transport system: and removing the first packaging and the second packaging in a packaging chamber of the second semiconductor transport system, wherein an internal temperature of the standby chamber, in which the accommodation container is in standby, of the first semiconductor transport system, is maintained in a range of 18° C. to 23.5° C., and internal humidity of the standby chamber of the first semiconductor transport system is maintained in a range of 0% to 45%.

BRIEF DESCRIPTION OF THE DRAWINGS

Embodiments will be more clearly understood from the following detailed description taken in conjunction with the accompanying drawings in which.

DETAILED DESCRIPTION

Figure 1:
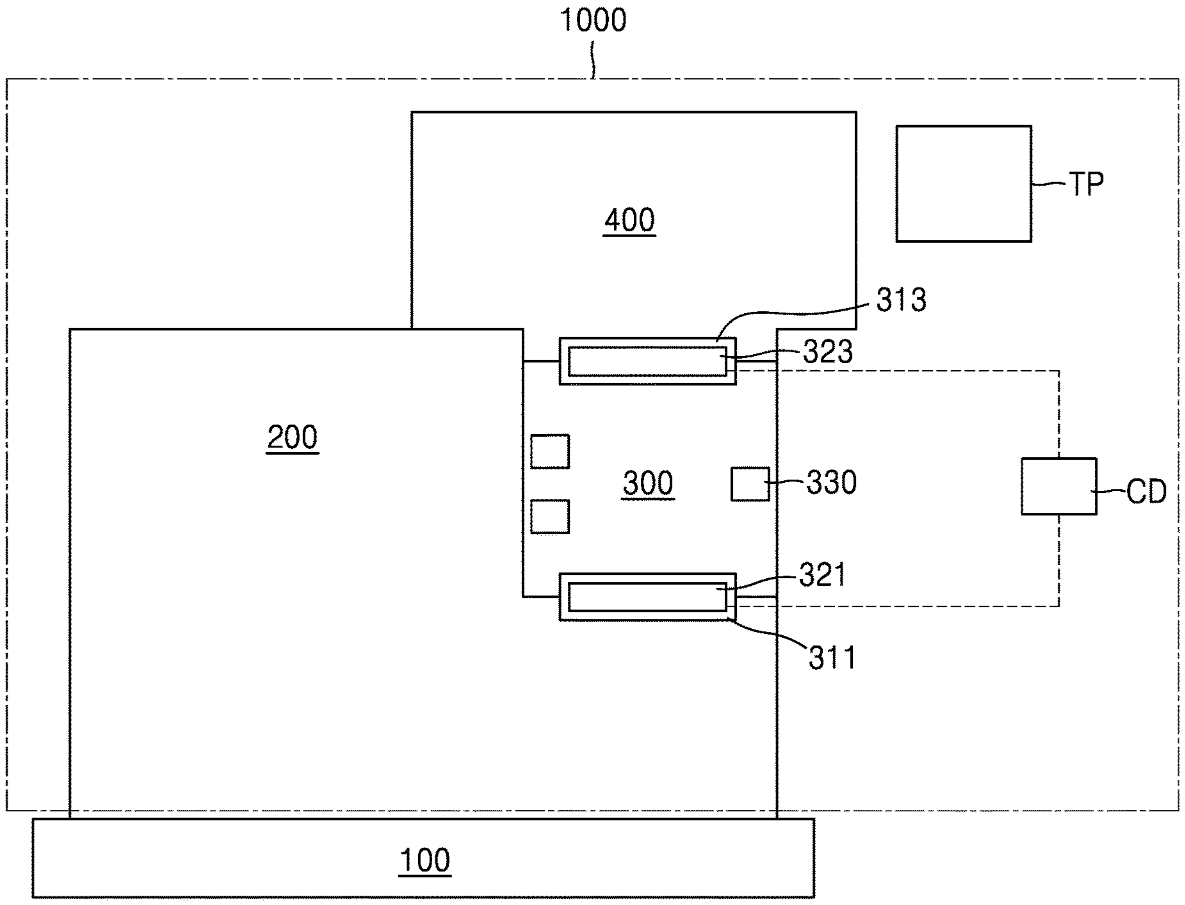
FIG. 1 is a layout diagram of a semiconductor transport system according to an embodiment.

Hereinafter, non-limiting example embodiments of the present disclosure are described in detail with reference to the accompanying drawings. Identical reference numerals are used for the same constituent elements in the drawings, and duplicate descriptions thereof may be omitted.

It will be understood that when an element is referred to as being "on," "connected to," or "coupled to" another element, it can be directly on, connected to, or coupled to the other element or intervening elements may be present. In contrast, when an element is referred to as being "directly on," "directly connected to," or "directly coupled to" another element, there are no intervening elements present.

FIG. 1 is a layout diagram of a semiconductor transport system 1000 according to an embodiment.

Referring to FIG. 1, the semiconductor transport system 1000 may include a packaging chamber 200, a standby chamber 300, and a transport chamber 400, and may be connected to a semiconductor manufacturing space 100.

The semiconductor manufacturing space 100 may include a clean room where processes for manufacturing a semiconductor device are performed. For example, the semiconductor manufacturing space 100 may include a clean room where a exposure process and a developing process are performed. A wafer, on which a process has been performed in the semiconductor manufacturing space 100, may be accommodated in an accommodation container. The accommodation container may be configured to accommodate a plurality of wafers. For example, the accommodation container may accommodate a plurality of wafers on which processes have been performed in the semiconductor manufacturing space 100. The accommodation container may include, for example, a front opening unified pod (FOUP) but is not limited thereto. The accommodation container accommodating the wafer may be transported from the semiconductor manufacturing space 100 to other semiconductor manufacturing spaces, in which processes different from the process performed on the wafer is to be performed, by using the semiconductor transport system 1000.

The packaging chamber 200 may be connected to the semiconductor manufacturing space 100. The packaging chamber 200 may include a space in which the accommodation container moved from the semiconductor manufacturing space 100 is packaged. In some embodiments, the inside of the accommodation container moved from the semiconductor manufacturing space 100 to the packaging chamber 200 may be filled with nitrogen gas. For example, the inside of the accommodation container may be filled with nitrogen gas in the semiconductor manufacturing space 100, and then, the accommodation container filled with nitrogen gas may be moved from the semiconductor manufacturing space 100 to the packaging chamber 200. By filling the inside of the accommodation container with nitrogen gas, the temperature and humidity inside the accommodation container may be maintained within constant ranges.

An automatic vinyl packaging machine may be arranged in the packaging chamber 200. The automatic vinyl packaging machine may primarily vinyl-package the accommodation container which has been moved to the packaging chamber 200.

The standby chamber 300 may be connected to the packaging chamber 200. The accommodation container packaged in the packaging chamber 200 may be moved to the standby chamber 300 and accommodated in the standby chamber 300 for a certain time. For example, the accommodation container packaged in the packaging chamber 200 may be moved to the standby chamber 300 and then may be accommodated in the standby chamber 300 for a certain time until transported to another semiconductor manufacturing space, where another process different from that performed in the semiconductor manufacturing space 100 is to be performed.

A temperature control device 330 (e.g., a temperature controller) may be arranged in the standby chamber 300. The temperature control device 330 may maintain the temperature inside the standby chamber 300 within a certain range. For example, the temperature control device 330 may maintain the temperature inside the standby chamber 300 within a range of about 18° C. to about 23.5° C. The temperature control device 330 may include, for example, a heating device, such as a hot-air heater, but is not limited thereto. Although FIG. 1 illustrates that three of the temperature control device 330 are arranged in the standby chamber 300, embodiments of the present disclosure are not limited thereto.

A first door 311 may be arranged between the packaging chamber 200 and the standby chamber 300. The packaging chamber 200 and the standby chamber 300 may be connected to or disconnected from each other according to the operation of the first door 311. For example, when the first door 311 is opened, the packaging chamber 200 and the standby chamber 300 may be connected to each other, and when the first door 311 is closed, the packaging chamber 200 and the standby chamber 300 may be disconnected from each other.

A first air curtain 321 may be arranged on the first door 311. The first air curtain 321 may prevent air from entering the standby chamber 300, even when the first door 311 is opened and the packaging chamber 200 and the standby chamber 300 are connected to each other. Accordingly, even when the first door 311 is opened, the internal temperature and the internal humidity of the standby chamber 300 may not be affected by the external environment (that is, the air in the packaging chamber 200). Although, in FIG. 1, one first air curtain 321 is illustrated as arranged on the first door 311, embodiments of the present disclosure are not limited thereto and various numbers of the first air curtain 321 may be arranged on the first door 311 depending on the size of the first door 311.

A second door 313 may be arranged between the standby chamber 300 and the transport chamber 400. The standby chamber 300 and the transport chamber 400 may be connected to or disconnected from each other according to the operation of the second door 313. For example, when the second door 313 is opened, the standby chamber 300 and the transport chamber 400 may be connected to each other, and when the second door 313 is closed, the standby chamber 300 and the transport chamber 400 may be disconnected from each other.

A second air curtain 323 may be arranged on the second door 313. The second air curtain 323 may prevent air from entering the standby chamber 300, even when the second door 313 is opened and the standby chamber 300 and the transport chamber 400 are connected to each other. Accordingly, even when the second door 313 is opened, the internal temperature and the internal humidity of the standby chamber 300 may not be affected by the external environment (that is, the air in the transport chamber 400). Although, in FIG. 1, one second air curtain 323 is illustrated as arranged on the second door 313, embodiment of the present disclosure are not limited thereto and various numbers of the second air curtain 323 may be arranged on the second door 313 depending on the size of the second door 313.

A control device CD (e.g., a controller) may be configured to control the operation of the first door 311, the operation of the second door 313, the operation of the first air curtain 321, and the operation of the second air curtain 323. For example, the control device CD may be configured to transceive electrical signals to and from the first door 311, the second door 313, the first air curtain 321, and the second air curtain 323, and in this manner, may be configured to control the operation of the first door 311, the operation of the second door 313, the operation of the first air curtain 321, and the operation of the second air curtain 323.

The control device CD may be implemented as hardware, firmware, software, or a combination thereof. For example, the control device CD may include a computing device, such as a workstation computer, a desktop computer, a laptop computer, and a tablet computer. For example, the control device CD may include a memory device, such as read only memory (ROM) and random access memory (RAM), and a processor configured to perform certain operations and algorithms, such as a microprocessor, a central processing unit (CPU), and a graphics processing unit (GPU). In addition, the control device CD may include a receiver and a transmitter for receiving and transmitting electrical signals, respectively. According to embodiments, the control device CD may include at least one processor and memory storing computer program instructions. The computer program instructions, when executed by the at least one processor, may be configured to cause the control device CD to perform its functions.

In an embodiment, the control device CD may be configured to close at least one of the first door 311 and the second door 313. For example, the control device CD may be configured to open the first door 311 only when the second door 313 is closed, and may be configured to open the second door 313 only when the first door 311 is closed. In this manner, by preventing both the first door 311 and the second door 313 from being opened at the same time, breaking away of the internal temperature and the internal humidity inside the standby chamber 300 from certain ranges, which is caused by the external air entering the standby chamber 300, may be prevented.

In an embodiment, the control device CD may be configured to operate the first air curtain 321 when the first door 311 is opened, and may be configured to operate the second air curtain 323 when the second door 313 is opened. In this manner, even when the first door 311 or the second door 313 is opened, by preventing the external air from entering the standby chamber 300, the internal temperature and the internal temperature in the standby chamber 300 may be maintained within certain ranges.

In an embodiment, the internal temperature of the standby chamber 300 may be maintained within the range of about 18° C. to about 23.5° C., and the internal humidity of the standby chamber 300 may be maintained within the range of about 0% to about 45%. For example, by the operation of the first air curtain 321, the operation of the second air curtain 323, and the operation of the temperature control device 330, the internal temperature of the standby chamber 300 may be maintained at about 18° C., and the internal humidity of the standby chamber 300 may be maintained at about 42%. By maintaining the temperature and humidity inside the standby chamber 300 within certain ranges, the temperature and humidity inside the accommodation container may also be maintained within certain ranges, even while the accommodation container is accommodated in the standby chamber 300 for a certain time.

The transport chamber 400 may include a space for transporting the accommodation container accommodated in the standby chamber 300 for a certain time to another semiconductor manufacturing space in which a process different from a process having been performed on the wafer in the semiconductor manufacturing space 100 is to be performed. For example, the accommodation container may be moved by a transport means TP (e.g., a transporter) from the standby chamber 300 to the transport chamber 400, and the accommodation container may be transported to the another semiconductor manufacturing space in which a process different from a process having been performed on the wafer in the semiconductor manufacturing space 100 is to be performed. The transport means TP may transport the accommodation container from the transport chamber 400 to a semiconductor manufacturing space in which another process is performed. For example, the transport means TP may include a transport means, such as a truck and a forklift. In an embodiment, the transport means TP may include a transport means using fuel which does not emit sulfur oxide ($SO_x$) as an exhaust gas. For example, the transport means TP may include a transport means using liquid propane gas (LPG), electricity, and hydrogen as fuel.

The semiconductor transport system 1000 according to embodiments of the present disclosure may include a packaging chamber 200 configured to package the accommodation container accommodating a wafer, a standby chamber 300 configured to accommodate the packaged accommodation container for a certain time, and the first air curtain 321, the second air curtain 323, and the temperature control device 330, which are arranged inside the standby chamber 300. In this case, by the operation of the first air curtain 321, the operation of the second air curtain 323, and the operation of the temperature control device 330, the internal temperature of the standby chamber 300 may be maintained in a range of about 18° ° C. to about 23.5° C., and the internal humidity of the standby chamber 300 may be maintained in a range of about 0% about 45%. In this manner, even after the accommodation container is packaged in the packaging chamber 200, the accommodation container packaged therein is transported to the standby chamber 300 and accommodated in the standby chamber 300 for a certain time, the internal temperature of the accommodated accommodation container may be maintained at about 18° C. or higher, and the internal humidity of the accommodated accommodation container may be maintained at about 39% or higher. Accordingly, a rapid reduction of the volume of an internal gas of the accommodation container due to a rapid drop of the internal temperature of the accommodation container by the external environment may be prevented, and in this manner, the contamination of the wafer due to the contaminant may be prevented by preventing an inflow of the contaminant into the accommodation container from the outside which occurs when the volume of the internal gas of the accommodation container is reduced.

Figure 2:
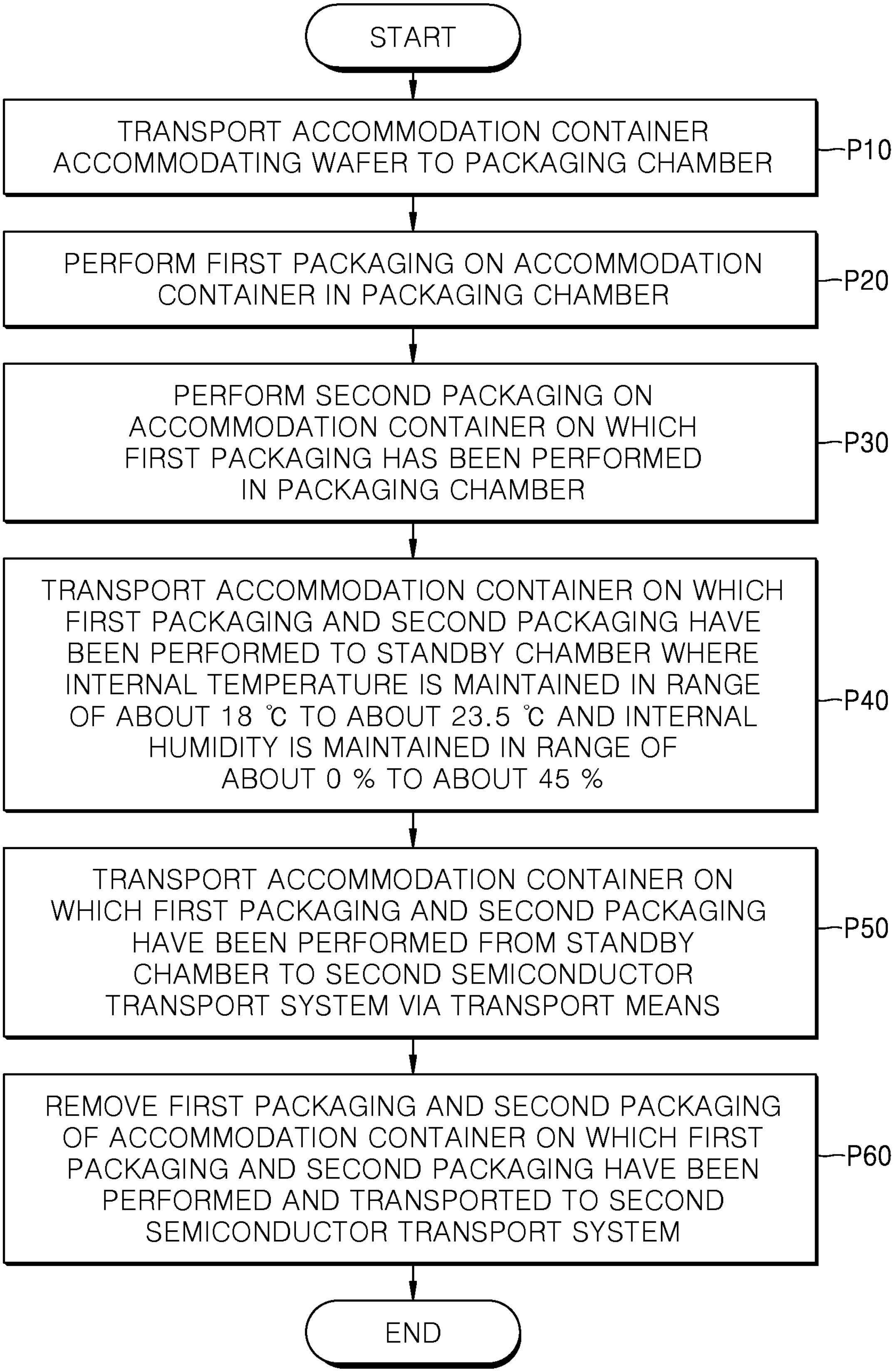
FIG. 2 is a flowchart of a method of transporting a semiconductor, according to an embodiment.

FIG. 2 is a flowchart of a method of transporting a semiconductor, according to an embodiment. FIGS. 3A through 3I are diagrams for describing a method of transporting a semiconductor, according to embodiments. FIGS. 4A through 4C are diagrams for describing a method of transporting a semiconductor, according to embodiments. FIGS. 3A through 3I are diagrams illustrating layouts of a semiconductor transport system for describing each operation of the method of transporting a semiconductor, and FIGS. 4A through 4C are cross-section views of an accommodation container for describing each operation of a method of transporting a semiconductor.

Figure 3A:
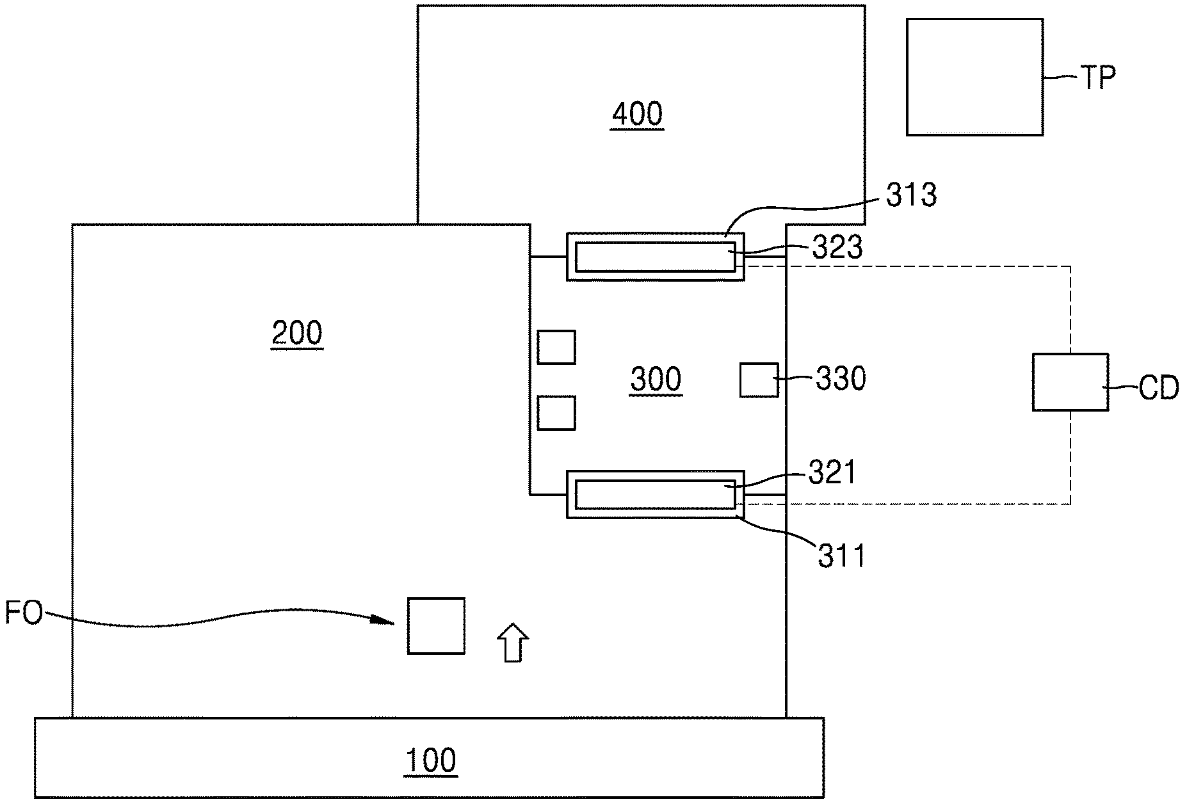
FIGS. 3A through 3I are layout diagrams of a semiconductor transport system for describing a semiconductor transport system, according to embodiments.
Figure 4A:
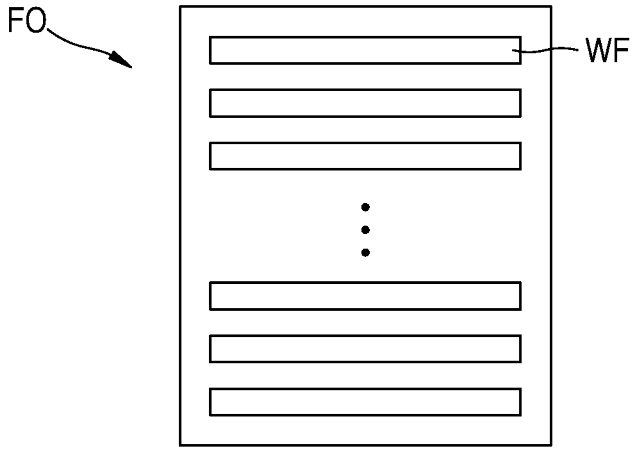
FIGS. 4A through 4C are cross-sectional views of an accommodation container for describing a method of transporting a semiconductor, according to embodiments.
Figure 4B:
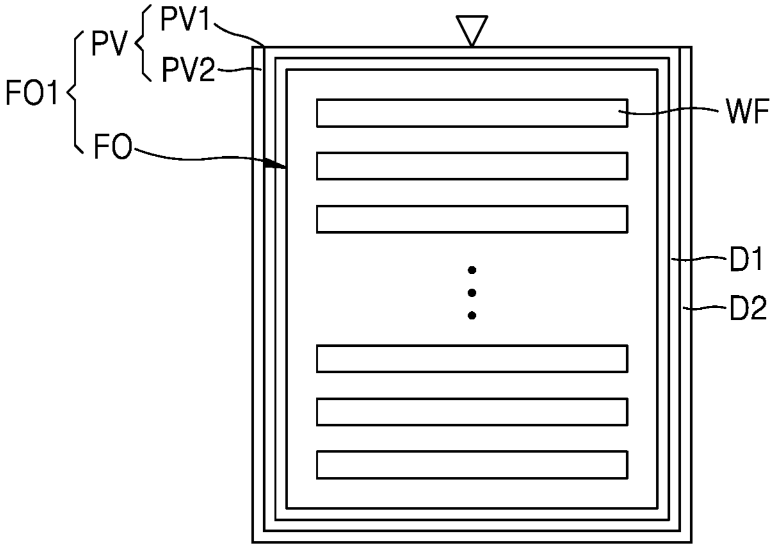
Figure 4C:
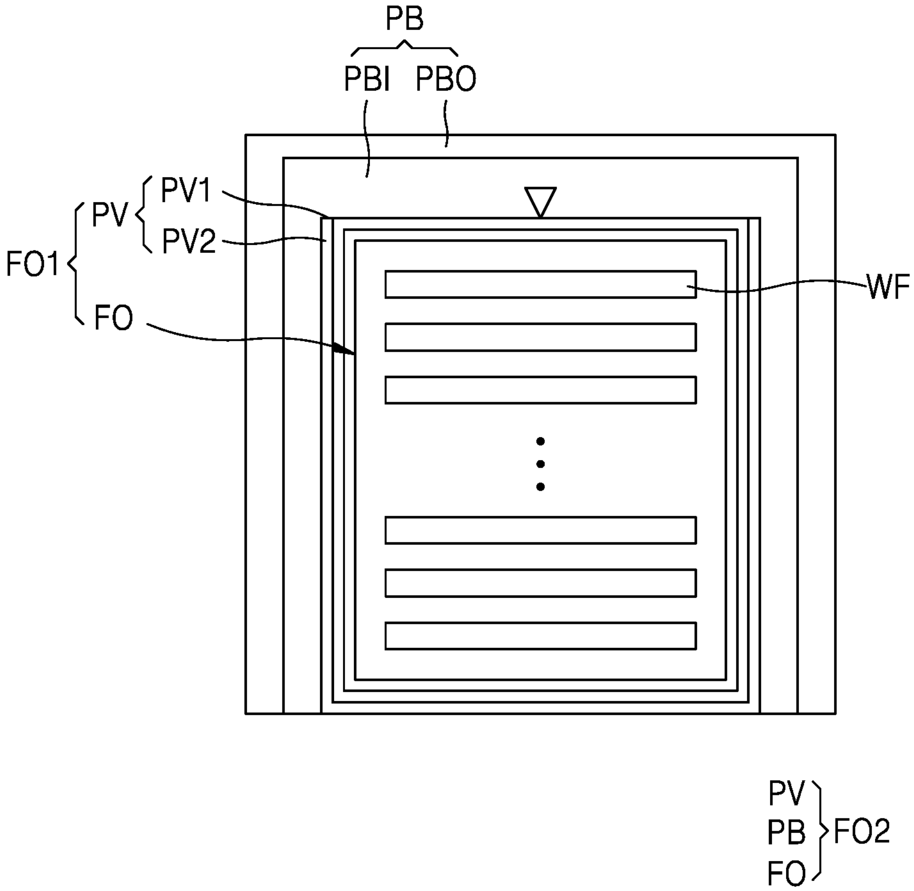

Referring to FIGS. 2, 3A, and 4A, an accommodation container FO configured to accommodate one or more wafers WF may first be transported from the semiconductor manufacturing space 100 to the packaging chamber 200 (step P10). The accommodation container FO may include, for example, a FOUP. The accommodation container FO may accommodate a plurality of wafers WF. For example, the accommodation container FO may accommodate eighteen wafers WF. The wafer WF accommodated in the accommodation container FO may include a wafer in which a portion of a semiconductor manufacturing process has been performed in the semiconductor manufacturing space 100. For example, the wafers WF may include a wafer accommodated in the accommodation container FO after the exposure process and development process are performed in the semiconductor manufacturing space 100. In an embodiment, an operation of filling nitrogen gas inside the accommodation container FO may be performed before the accommodation container FO is transported to the packaging chamber 200. By filling nitrogen gas inside the accommodation container FO, the internal temperature and the internal humidity of the accommodation container FO may be maintained within certain ranges.

Figure 3B:
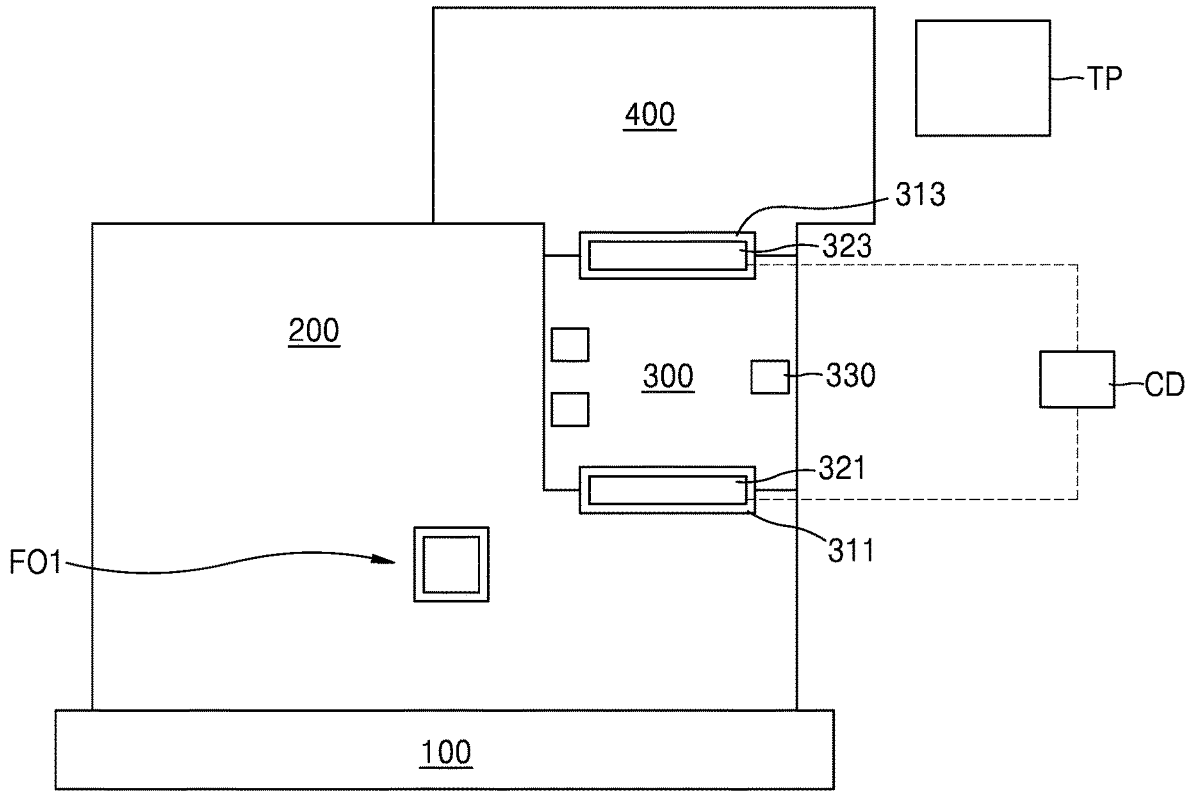

Referring to FIGS. 2, 3B, and 4B, after the operation results of FIGS. 3A and 4A, a first packaging operation of packaging the accommodation container FO moved to the packaging chamber 200 may be performed (step P20). In an embodiment, the first packaging operation may include an operation of packaging the accommodation container FO with vinyl PV. In an embodiment, the first packaging operation may include an operation of packaging the accommodation container FO with vinyl PV multiple times. For example, the first packaging operation may include an operation of packaging the accommodation container FO with vinyl PV twice. In this case, in the first packaging operation, the accommodation container FO may be primarily packaged with a first vinyl PV1 by an automatic vinyl packaging machine arranged inside the packaging chamber 200, and then the accommodation container FO packaged with the first vinyl PV1 may be manually packaged with a second vinyl PV2. By performing the first packaging operation of packaging the accommodation container FO multiple times by using vinyl PV, the internal temperature and the internal humidity of the accommodation container FO may be maintained within certain ranges without being affected by the external environment. In an embodiment, in the first packaging operation, the accommodation container FO may be packaged by the vinyl PV in a twist packaging method. The twist packaging method may include a method of rotating and twisting the inlet portion of the vinyl PV used to vinyl package the accommodation container FO, and sealing the inlet portion of the twisted vinyl PV. In an embodiment, the thickness of the vinyl PV used in the first packaging operation may be about 0.025 mm to about 0.04 mm. For example, the thickness of the vinyl PV used in the first packaging operation may be about 0.04 mm. After the first packaging operation described with reference to FIGS. 2, 3B, and 4B is performed, the accommodation container FO packaged with the vinyl PV and the vinyl PV packaging the accommodation container FO may be referred to as a first packaged accommodation container FO1.

Referring to FIGS. 2, 3, and 4C, after the operation results of FIGS. 3B and 4B, a second packaging operation packaging the first packaged accommodation container FO1 may be performed (step P30). In an embodiment, the second packaging operation may include an operation of packaging the first packaged accommodation container FO1 by using a logistics bag PB. In an embodiment, the second packaging operation may include an operation of packaging the first packaged accommodation container FO1 by using the logistics bag PB including an inner skin PBI and an outer skin PBO. In this case, as the first packaged accommodation container FO1 is accommodated in an internal space provided by the inner skin PBI of the logistics bag PB, the first packaged accommodation container FO1 may be packaged by the logistics bag PB. By performing the second packaging operation by using the logistics bag PB including the inner skin PBI and the outer skin PBO, which are not one single configuration, the internal temperature and the internal humidity of the accommodation container FO may not be affected by the external environment but may be maintained within certain ranges. In an embodiment, the second packaging operation may include an operation of packaging the first packaged accommodation container FO1 by using the logistics bag PB including a waterproof material. The waterproof material may include, for example, polyvinylidene chloride (PVCD). After the second packaging operation described with reference to FIGS. 2, 3C, and 4C is performed, the first packaged accommodation container FO1 and the logistics bag PB packaging the first packaged accommodation container FO1 may be referred to as a second packaged accommodation container FO2

In an embodiment, the sum of the execution time of the first packaging operation described with reference to FIGS. 2, 3B, and 4B, and the execution time of the second packaging operation described with reference to FIGS. 2, 3C, and 4C may be about 5 minutes to about 20 minutes. When the sum of the execution time of the first packaging operation and the execution time of the second packaging operation exceeds about 20 minutes, the internal temperature and the internal humidity of the accommodation container FO may not be maintained within certain target ranges.

Figure 3C:
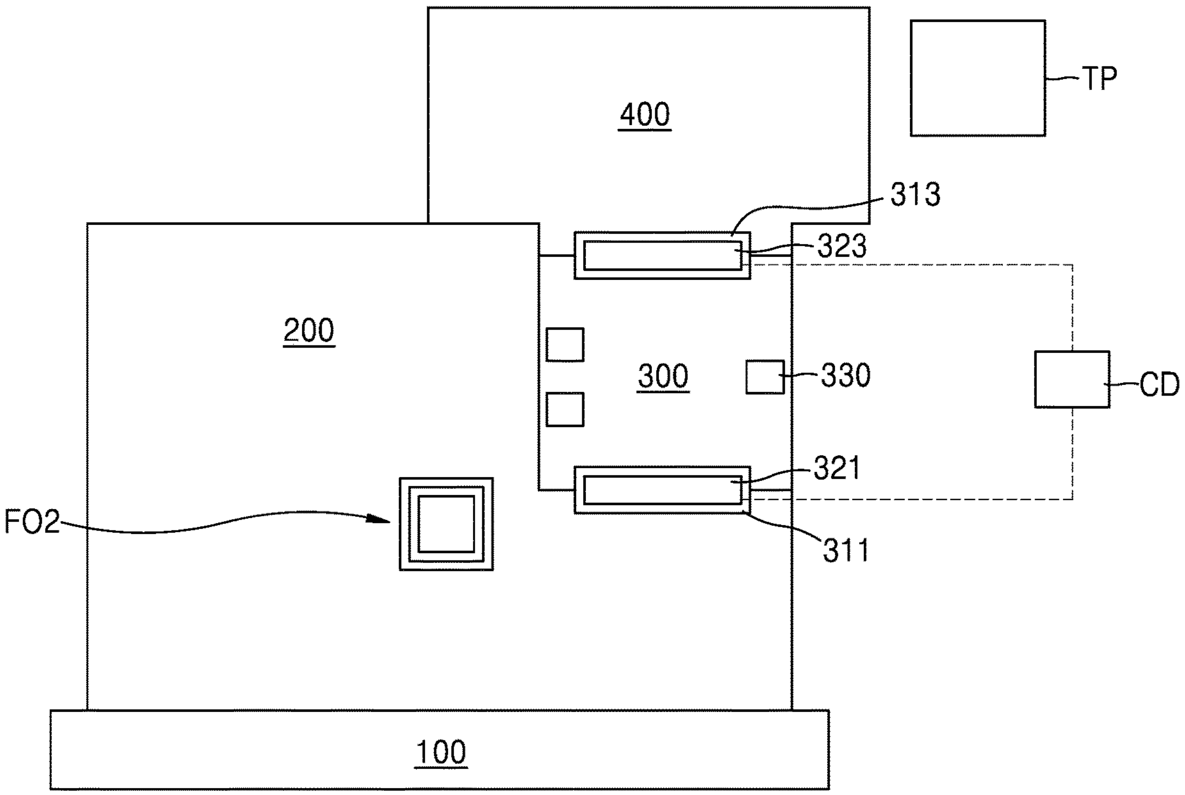
Figure 3D:
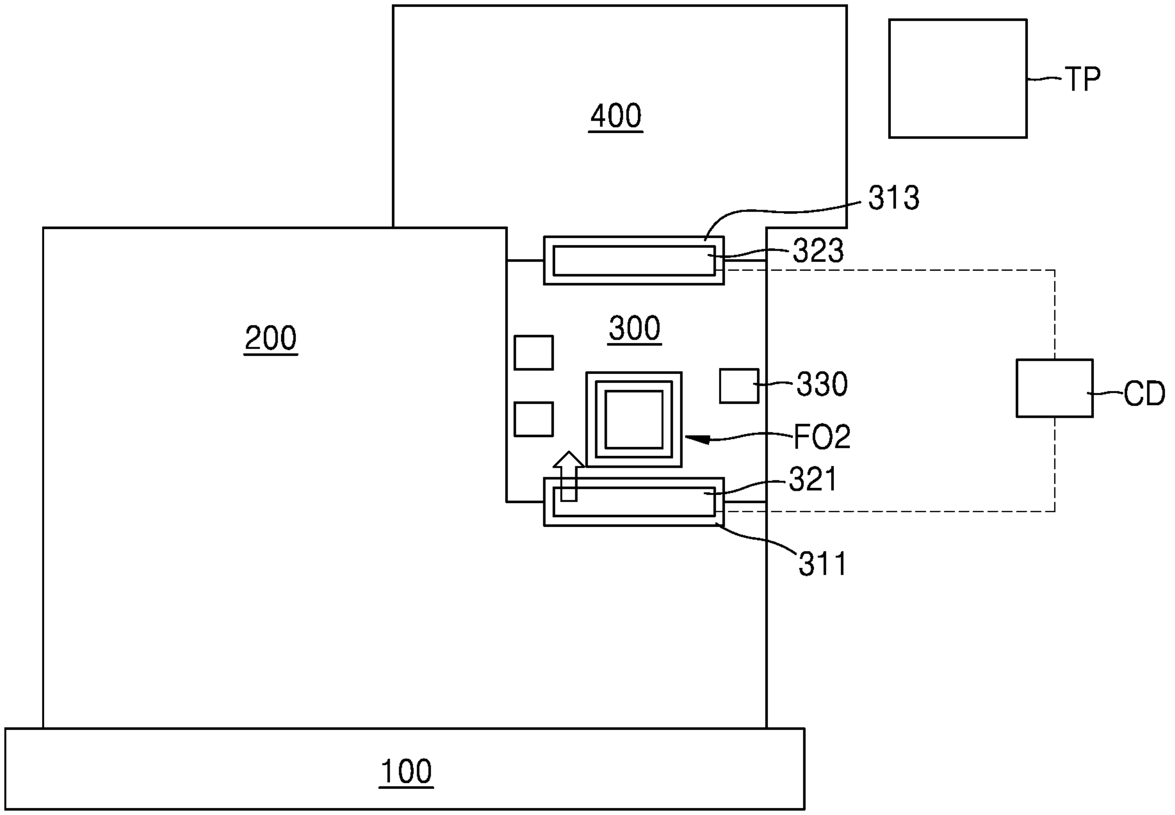

Referring to FIGS. 2 and 3D, after the operation results of FIGS. 3C and 4C, the second packaged accommodation container FO2 may be transported from the packaging chamber 200 to the standby chamber 300 (step P40). The second packaged accommodation container FO2 may be transported from the packaging chamber 200 to the standby chamber 300 through the opened first door 311, after the first door 311 between the packaging chamber 200 and the standby chamber 300 is opened. In an embodiment, the first door 311 may operate to be opened only when the second door 313 is closed by the control device CD. In an embodiment, the first air curtain 321 arranged on the first door 311 may be configured to operate when the first door 311 is opened. When the first door 311 is opened, and the first air curtain 321 is operated, the air of the packaging chamber 200 may be prevented from entering the standby chamber 300, and the internal temperature and the internal humidity of the standby chamber 300 may be maintained within certain ranges. When the second packaged accommodation container FO2 is transported from the packaging chamber 200 to the standby chamber 300, the first door 311 may be closed, and the first air curtain 321 may not operate. The second packaged accommodation container FO2 transported to the standby chamber 300 may be accommodated in the standby chamber 300 for a certain time until transportation preparation by using the transport means TP is completed.

Figure 3E:
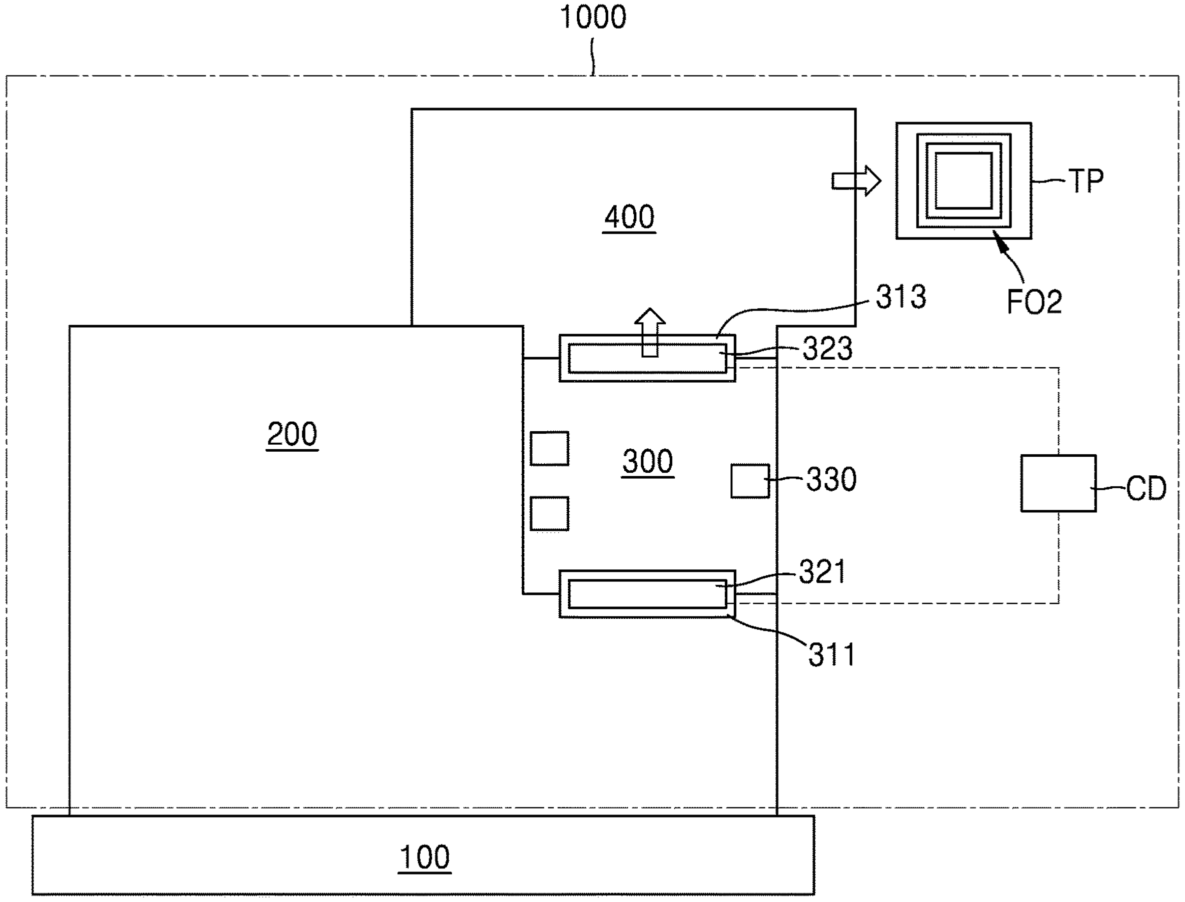

Referring to FIGS. 2 and 3E, when the transport of the second packaged accommodation container FO2 is prepared after the operation result of FIG. 3D, the second packaged accommodation container FO2 accommodated in the standby chamber 300 may be transported to the transport means TP in the transport chamber 400 (step P50). After the second packaged accommodation container FO2 is transported from the standby chamber 300 to the transport chamber 400 via the second door 313, the second packaged accommodation container FO2 may be transported to the transport means TP in the transport chamber 400. In an embodiment, the second door 313 may operate to be opened only when the first door 311 is closed by the control device CD. In an embodiment, the second air curtain 323 arranged on the second door 313 may be configured to operate when the second door 313 is opened. When the second door 313 is opened and the second air curtain 323 is operated, the air of the transport chamber 400 may be prevented from entering the standby chamber 300, and the internal temperature and the internal humidity of the standby chamber 300 may be maintained within certain ranges. When the second packaged accommodation container FO2 is moved from the standby chamber 300 to the transport chamber 400, the second door 313 may be closed, and the second air curtain 323 may not operate. Thereafter, the second packaged accommodation container FO2 transported to the transport means TP may be transported to a second semiconductor transport system 1000*a* by the transport means TP.

Figure 3F:
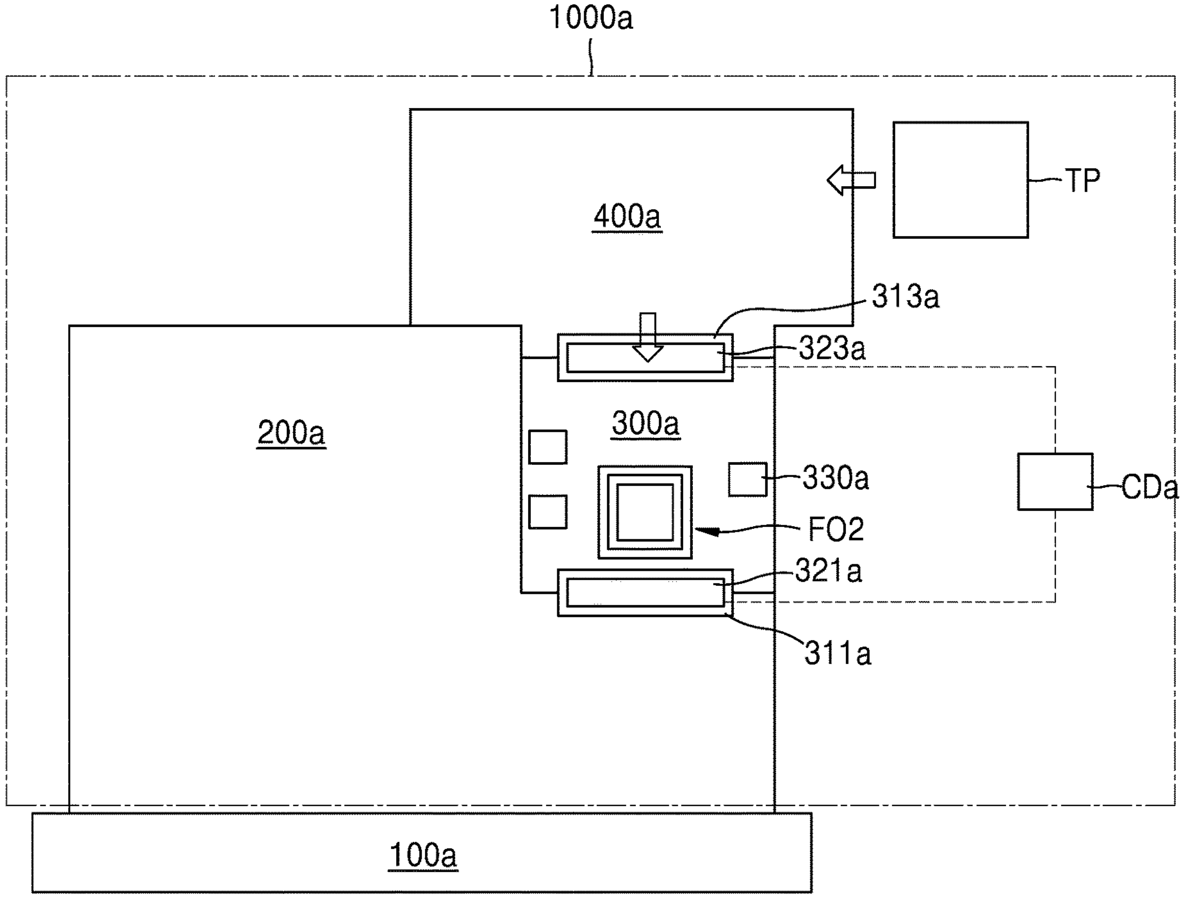

Referring to FIGS. 2 and 3F, after the operation result of FIG. 3E, the second packaged accommodation container FO2 transported to the second semiconductor transport system 1000*a* may be transported from the transport means TP to a second standby chamber 300*a* via a second transport chamber 400*a* (step P60). In this case, the second semiconductor transport system 1000*a* may be connected to a second semiconductor manufacturing space 100*a* where a process different from the process having been performed in the semiconductor manufacturing space 100 is to be performed, and may include a second semiconductor transport system for transporting a wafer on which a process has been performed in the second semiconductor manufacturing space 100*a*. The second semiconductor transport system 1000*a* may have a configuration that is substantially the same as or similar to that of the semiconductor transport system 1000 described with reference to FIG. 1. For example, the second semiconductor transport system 1000*a* may include a second packaging chamber 200*a*, a second standby chamber 300*a*, and a second transport chamber 400*a*, and the second packaging chamber 200*a*, the second standby chamber 300*a*, and the second transport chamber 400*a* may be substantially the same as or similar to the packaging chamber 200, the standby chamber 300, and the transport chamber 400 described with reference to FIG. 1, respectively. For example, the second standby chamber 300*a* may include a temperature control device 330*a*, a first door 311*a* may be arranged between the second packaging chamber 200*a* and the second standby chamber 300*a*, a first curtain 321*a* may be arranged on the first door 311, a second door 313*a* may be arranged between the second standby chamber 300*a* and the second transport chamber 400*a*, a second air curtain 323*a* may be arranged on the second door 313*a*, and a control device CDa may be included in the second semiconductor transport system 1000*a*.

The second packaged accommodation container FO2 transported to the second standby chamber 300*a* may be accommodated in the second standby chamber 300*a* for a certain time until preparations for un-packaging of the second packaged accommodation container FO2 is completed.

Figure 3G:
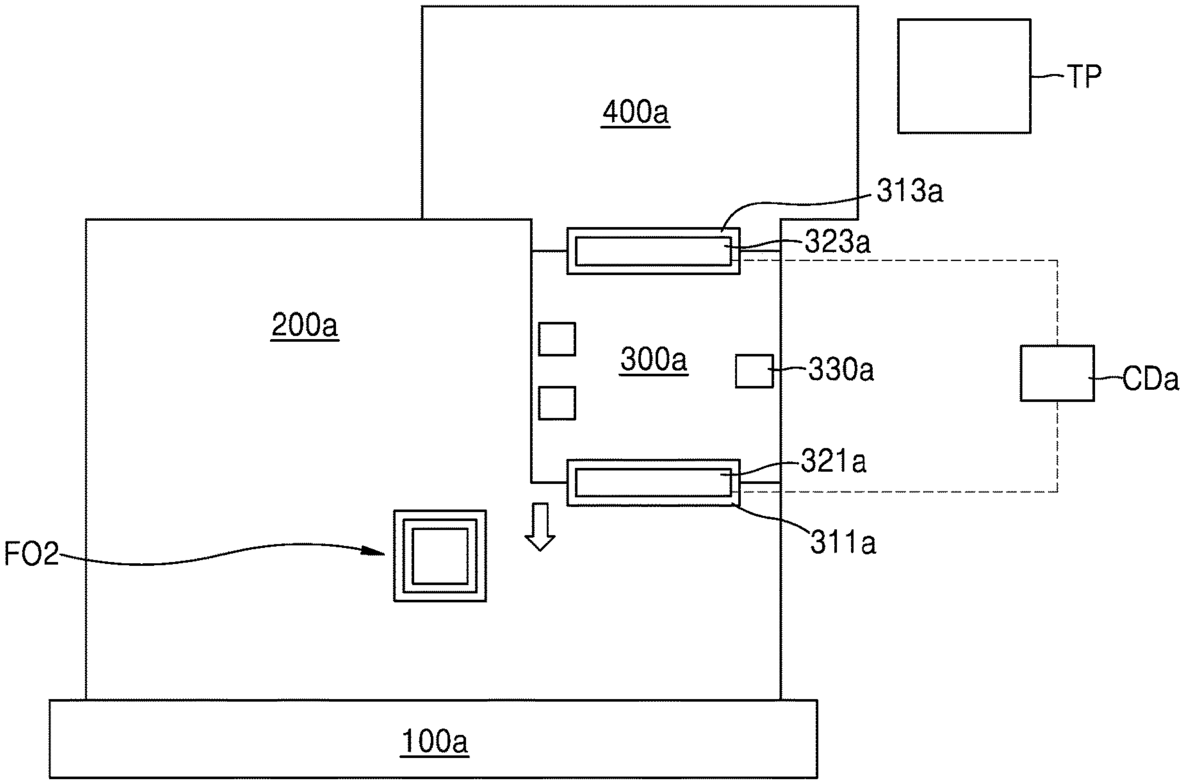
Figure 3H:
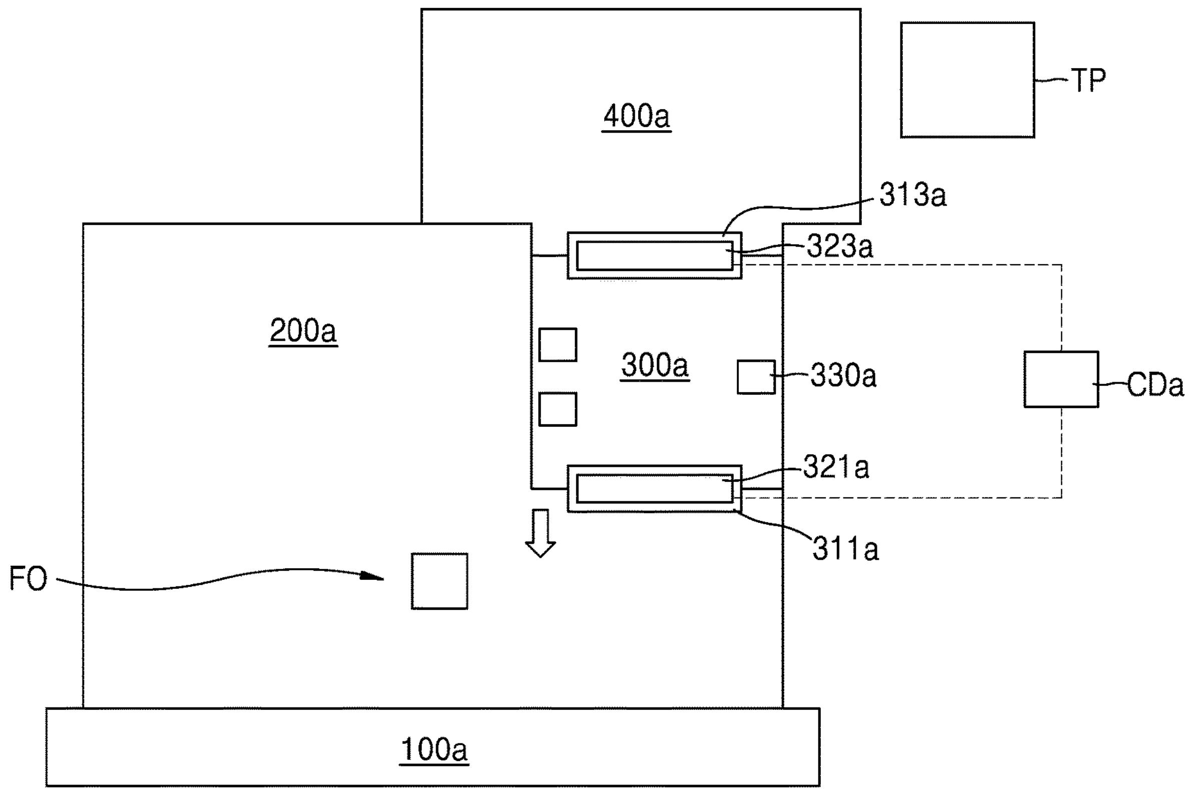

Referring to FIGS. 2, 3G, and 3H, from the operation result of FIG. 3F, the second packaged accommodation container FO2 may be transported from the second standby chamber 300*a* to the second packaging chamber 200*a*. Next, from the second packaged accommodation container FO2 transported to the second packaging chamber 200*a*, the packaging by using the logistics bag PB (refer to FIG. 4C) and the packaging by using the vinyl PV (refer to FIG. 4C) may be sequentially removed (step P60). The accommodation container FO (refer to FIG. 4C) may be exposed to the second packaging chamber 200*a*, by removing the packaging by using the logistics bag PB and the packaging by using the vinyl PV.

Figure 3I:
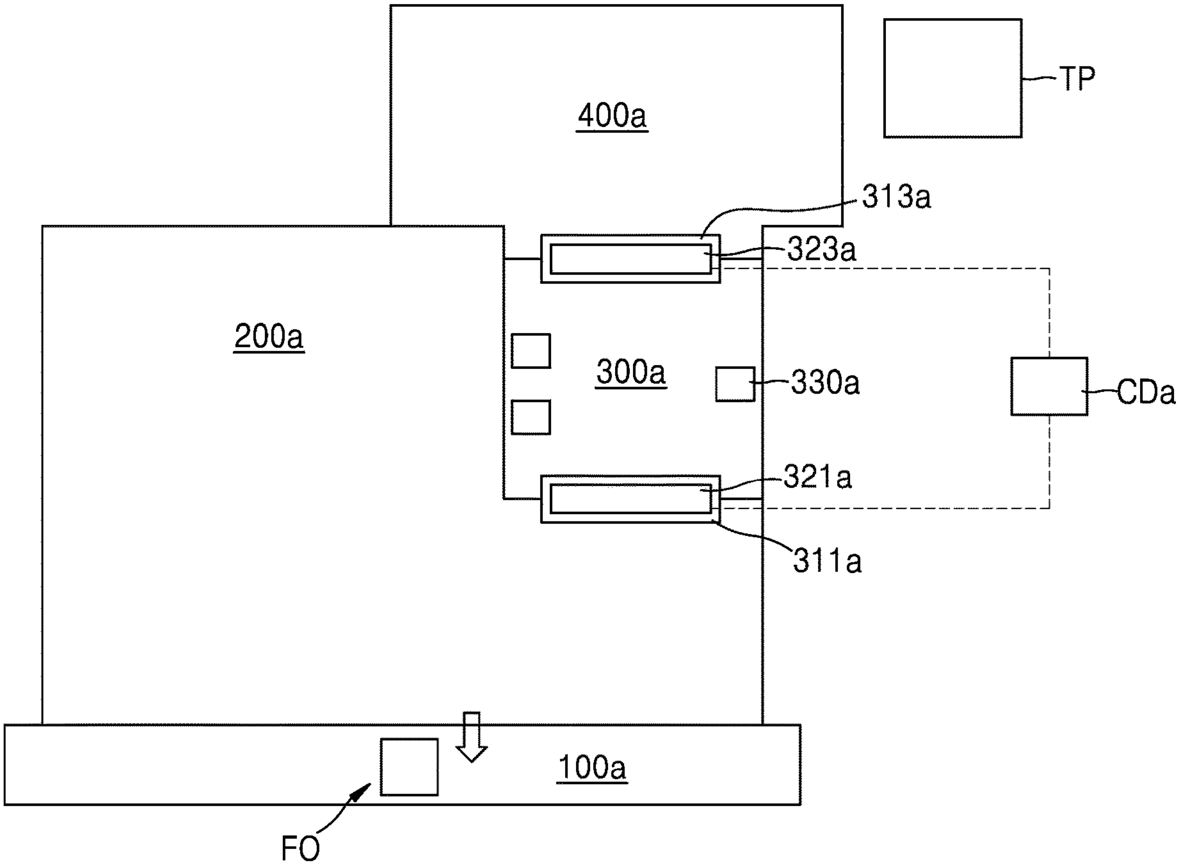

Referring to FIGS. 2 and 3I, from the operation result of FIG. 3H, the accommodation container FO may be provided from the second packaging chamber 200*a* to the second semiconductor manufacturing space 100*a*. In the second semiconductor manufacturing space 100*a*, the accommodation container FO may be opened, and the semiconductor manufacturing process may be performed on the wafer accommodated in the accommodation container FO.

In an embodiment, after the packaging by using the logistics bag PB is removed, the logistics bag PB used to package the accommodation container FO may be cleaned. In this manner, external contaminants, which may have been attached to the logistics bag PB, may be removed during the transport process of the accommodation container FO.

In an embodiment, nitrogen gas may be filled inside the accommodation container FO provided from the second packaging chamber 200*a* to the second semiconductor manufacturing space 100*a*. After filling nitrogen gas inside of the accommodation container FO provided from the second packaging chamber 200*a* to the second semiconductor manufacturing space 100*a*, the wafer accommodated in the accommodation container FO may be taken out by opening the accommodation container FO filled with nitrogen gas therein. Humidity inside the accommodation container FO may be maintained by additionally charging nitrogen gas, before the accommodation container FO is opened, and the surface of the wafer WF accommodated inside the accommodation container FO may be cured by using the nitrogen gas.

The method of transporting a semiconductor, according to the embodiments of the present disclosure, may include operations of performing the first and second packaging operations on the accommodation container FO in the packaging chamber 200, accommodating the second packaged accommodation container FO2, on which the packaging has been completed, for a certain time until the transport preparation is completed, and transporting the second packaged accommodation container FO2 accommodated in the standby chamber 300 by using the transport means TP after the transport preparation is completed. In addition, in this case, the temperature inside the standby chamber 300, where the second packaged accommodation container FO2 is accommodated, may be maintained in a range of about 18° C. to about 23.5° C., and the humidity inside the standby chamber 300 may be maintained in a range of about 0% to about 45%. In this manner, even when the second packaged accommodation container FO2 is accommodated in the standby chamber 300 for a certain time, the internal temperature of the accommodation container FO may be maintained at about 18° C. or higher, and the internal humidity thereof may be maintained at about 39% or higher. Accordingly, a rapid reduction of the volume of an internal gas of the accommodation container FO due to a rapid drop of the internal temperature of the accommodation container FO by the external environment may be prevented, and in this manner, the contamination of the wafer due to the contaminant may be prevented by preventing an inflow of the contaminant into the accommodation container FO from the outside which occurs when the volume of the internal gas of the accommodation container FO is reduced.

While non-limiting example embodiments have been particularly shown and described in the present disclosure, it will be understood that various changes in form and details may be made therein without departing from the spirit and scope of the present disclosure.

What is claimed is:

1. A method of transporting a semiconductor, the method comprising:
- providing an accommodation container accommodating a wafer and including nitrogen gas to a packaging chamber;
- performing, in the packaging chamber, a first packaging on the accommodation container by packaging the accommodation container with vinyl;
- performing a second packaging on the accommodation container, on which the first packaging has been performed, by packaging the accommodation container with a logistics bag;
- transporting the accommodation container, on which the first packaging and the second packaging have been performed, to a standby chamber and standing by the accommodation container in the standby chamber; and
- transporting the accommodation container that was in standby in the standby chamber by using a transporter in a transport chamber,
- wherein an internal temperature of the standby chamber, in which the accommodation container is in standby, is maintained in a range of 18° C. to 23.5° C., and an internal humidity of the standby chamber is maintained in a range of 0% to 45%.

2. The method of transporting the semiconductor of claim 1, wherein the performing the first packaging comprises packaging the accommodation container twice with the vinyl.

3. The method of transporting the semiconductor of claim 2, wherein the packaging the accommodation container twice comprises packaging the accommodation container by using an automatic vinyl packaging machine in the packaging chamber and manually packaging the accommodation container packaged by the automatic vinyl packaging machine.

4. The method of transporting the semiconductor of claim 1, wherein the performing the first packaging comprises packaging the accommodation container in a twist packaging method with the vinyl.

5. The method of transporting the semiconductor of claim 1, wherein a thickness of the vinyl is 0.025 mm to 0.04 mm.

6. The method of transporting the semiconductor of claim 1, wherein the logistics bag includes an inner skin and an outer skin, and the accommodation container is accommodated in an internal space of the inner skin.

7. The method of transporting the semiconductor of claim 6, wherein a material of the logistics bag includes polyvinylidene chloride (PVDC).

8. The method of transporting the semiconductor of claim 1, wherein a sum of a time of the performing the first packaging and a time of the performing the second packaging is equal to or less than 20 minutes.

9. The method of transporting the semiconductor of claim 1, further comprising:
- opening a door arranged between the standby chamber and the packaging chamber and operating an air curtain that is on the door, while transporting the accommodation container to the standby chamber from the packaging chamber.

10. The method of transporting the semiconductor of claim 1, further comprising:
- opening a door arranged between the standby chamber and the transport chamber and operating an air curtain that is on the door, while transporting the accommodation container to the transport chamber from the standby chamber.

11. A method of transporting a semiconductor, the method comprising:
- providing an accommodation container accommodating a wafer and including nitrogen gas to a packaging chamber of a first semiconductor transport system;
- performing, in the packaging chamber, a first packaging on the accommodation container by packaging the accommodation container with vinyl;
- performing a second packaging on the accommodation container, on which the first packaging has been performed, by packaging the accommodation container with a logistics bag;
- transporting the accommodation container, on which the first packaging and the second packaging have been performed, to a standby chamber of the first semiconductor transport system, and standing by the accommodation container in the standby chamber;
- transporting the accommodation container that was in standby in the standby chamber to a second semiconductor transport system by using a transporter in a transport chamber of the first semiconductor transport system; and
- removing the first packaging and the second packaging in a packaging chamber of the second semiconductor transport system,
- wherein an internal temperature of the standby chamber, in which the accommodation container is in standby, of the first semiconductor transport system, is maintained in a range of 18° C. to 23.5° C., and internal humidity of the standby chamber of the first semiconductor transport system is maintained in a range of 0% to 45%.

12. The method of transporting the semiconductor of claim 11, wherein
- the performing the first packaging comprises packaging the accommodation container twice with the vinyl, and
- the packaging the accommodation container twice comprises packaging the accommodation container by using an automatic vinyl packaging machine arranged in the packaging chamber and manually packaging the accommodation container packaged by the automatic vinyl packaging machine.

13. The method of transporting the semiconductor of claim 12, wherein the performing the first packaging comprises packaging the accommodation container in a twist packaging method with the vinyl.

14. The method of transporting the semiconductor of claim 11, wherein the logistics bag includes an inner skin and outer skin, the accommodation container is accommodated in an internal space of the inner skin, and a material of the logistics bag includes polyvinylidene chloride (PVDC).

15. The method of transporting the semiconductor of claim 11, wherein a sum of a time of the performing the first packaging and a time of the performing the second packaging is equal to or less than 20 minutes.

16. The method of transporting the semiconductor of claim 11, further comprising cleaning the logistics bag after the removing the first packaging and the second packaging in the packaging chamber of the second semiconductor transport system.

* * * * *